(12) United States Patent
Li et al.

(10) Patent No.: US 10,566,383 B2
(45) Date of Patent: Feb. 18, 2020

(54) LIGHT EMITTING DIODE DISPLAY

(71) Applicant: PlayNitride Inc., Tainan (TW)

(72) Inventors: Yun-Li Li, Tainan (TW); Tzu-Yang Lin, Tainan (TW); Pei-Hsin Chen, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 16/154,732

(22) Filed: Oct. 9, 2018

(65) Prior Publication Data

US 2019/0131344 A1    May 2, 2019

(30) Foreign Application Priority Data

Oct. 30, 2017   (TW) .............................. 106137335 A

(51) Int. Cl.
*H01L 27/15* (2006.01)
*H01L 25/075* (2006.01)
*H01L 33/62* (2010.01)

(52) U.S. Cl.
CPC ........ *H01L 27/156* (2013.01); *H01L 25/0753* (2013.01); *H01L 33/62* (2013.01)

(58) Field of Classification Search
CPC .... H01L 25/0753; H01L 27/156; H01L 33/62
See application file for complete search history.

(56) References Cited

U.S. PATENT DOCUMENTS

2008/0090484 A1* 4/2008 Lee ..................... H01L 27/3211
                                                           445/49
2010/0258837 A1* 10/2010 Hori ....................... H01L 33/38
                                                           257/99
2016/0163765 A1* 6/2016 Hu ........................ H01L 27/156
                                                           257/93
2017/0211761 A1* 7/2017 Kuriki ..................... F21V 29/89
2018/0119931 A1* 5/2018 Bower ................. H01L 25/0753
2018/0315741 A1* 11/2018 Zhang ..................... H01L 24/13

FOREIGN PATENT DOCUMENTS

CN        106067475        11/2016
CN        106972045         7/2017

OTHER PUBLICATIONS

"Office Action of Taiwan Counterpart Application", dated Nov. 27, 2018, p. 1-p. 5.

* cited by examiner

*Primary Examiner* — Allan R Wilson
(74) *Attorney, Agent, or Firm* — JCIPRNET

(57) ABSTRACT

A light emitting diode display includes a plurality of display units and a plurality of auxiliary display units. The display units are arranged in an array and connected to each other. Each of the display units has a device arrangement region, a peripheral region surrounding the device arrangement region, and a plurality of first light emitting devices disposed on the device arrangement region and arranged in an array. The auxiliary display units are disposed on the peripheral regions of the display units. Each of the auxiliary display units includes an auxiliary substrate and a plurality of second light emitting devices arranged in an array. The second light emitting devices are disposed on the auxiliary substrate and located at a level different from a level of the first light emitting devices. Each of the auxiliary substrates is across adjacent two of the display units.

12 Claims, 5 Drawing Sheets

100c

LIGHT EMITTING DIODE DISPLAY

CROSS-REFERENCE TO RELATED APPLICATION

This application claims the priority benefit of Taiwan application serial no. 106137335, filed on Oct. 30, 2017. The entirety of the above-mentioned patent application is hereby incorporated by reference herein and made a part of this specification.

BACKGROUND

[Technical Field]

The disclosure relates to a display and particularly relates to a light emitting diode display using micro light emitting diodes (micro LEDs) as display pixels.

[Description of Related Art]

In recent years, for the purpose of maximizing the screen size, a display panel with a narrow side frame is more and more widely used in various kinds of devices. In order to implement a large-sized display, concepts and applications regarding splicing a plurality of display panels have gradually become popular. However, when the plurality of display panels are spliced into a large-sized display, the width of the side frame of the display panel often results in discontinuity in the display image at the junction between any adjacent two of the display panels. Besides, due to issues of process fineness, microscopic gaps may still be formed at the splice juncture on the side of each display panel.

SUMMARY

The disclosure provides a light emitting diode display of better display quality.

The light emitting diode display of this disclosure includes a plurality of display units and a plurality of auxiliary display units. The display units are arranged in an array and connected to each other. Each of the display units has a device arrangement region, a peripheral region surrounding the device arrangement region, and a plurality of first light emitting devices disposed on the device arrangement region and arranged in an array. The auxiliary display units are disposed on the peripheral regions of the display units. Each of the auxiliary display units includes an auxiliary substrate and a plurality of second light emitting devices arranged in an array. The second light emitting devices are disposed on the auxiliary substrate and located at a level different from a level of the first light emitting devices. Each of the auxiliary substrates is across adjacent two of the display units.

In an embodiment of the disclosure, a first horizontal spacing exists between adjacent two of the first light emitting devices on one of the display units. A second horizontal spacing exists between adjacent two of the second light emitting devices on one of the auxiliary display units. The first horizontal spacing is equal to the second horizontal spacing.

In an embodiment of the disclosure, a third horizontal spacing exists between one of the first light emitting devices and one of the second light emitting devices that are adjacent to each other. The third horizontal spacing is equal to the second horizontal spacing.

In an embodiment of the disclosure, a splice seam is formed between adjacent two of the display units, and the auxiliary display units are located on the splice seams respectively.

In an embodiment of the disclosure, a splice slit exists between adjacent two of the auxiliary display units, and the splice slit is across of the splice seams.

In an embodiment of the disclosure, each of the display units includes a substrate, a conducting circuit and a plurality of first pads. The substrate has the device arrangement region and the peripheral region, and the first pads are disposed on the device arrangement region of the substrate and are separated from each other. The first light emitting devices are electrically connected to the substrate by bonding to the first pads, and the conducting circuit is disposed on the peripheral region and electrically connects to at least one of the auxiliary display units.

In an embodiment of the disclosure, each of the auxiliary substrates has an upper surface and a lower surface that are opposite to each other, and the lower surface faces to the conducting circuit. Each of the auxiliary display units further includes a plurality of second pads and a plurality of conductive structures. The plurality of second pads are disposed on the upper surface of the auxiliary substrate. The second light emitting devices are electrically connected to the second pads. The plurality of conductive structures penetrate the auxiliary substrate and electrically connect the second pads to at least one of the conducting circuits.

In an embodiment of the disclosure, each of the auxiliary substrate has an upper surface, a lower surface opposite to the upper surface, and a side surface connecting the upper surface and the lower surface. Each of the auxiliary display units further includes a plurality of second pads and a plurality of connecting conductive lines. The plurality of second pads are disposed on the upper surface of the auxiliary substrate, wherein the second light emitting devices are electrically connected to the second pads. The plurality of conductive lines disposed on the auxiliary substrate, and the conductive lines from on the upper surface and extend to the side surface, and the conductive lines are connected the second pads to the conducting circuits.

In an embodiment of the disclosure, each of the first light emitting units has at least one micro LED and each of the second light emitting units has at least one micro LED. A step height between one of the micro LEDs on the auxiliary substrate and one of the micro LEDs on the substrate is 1 to 5 times a thickness of the one of the micro LEDs on the substrate.

In an embodiment of the disclosure, each of the first light emitting units has a plurality of micro LEDs and each of the second light emitting units has a plurality of micro LEDs. A step height between one of the micro LEDs of the first light emitting units and one of the micro LEDs of the second light emitting units is 1 to 5 times a thickness the one micro LEDs of the first light emitting units.

In an embodiment of the disclosure, the first light emitting devices and the second light emitting devices are identical in size.

In an embodiment of the disclosure, each of the first light emitting devices has at least one micro LED having a size length in a range of 10 μm to 60 μm and a thickness in a range of 3 μm to 8 μm.

In an embodiment of the disclosure, the light emitting diode display further includes a plurality of pixel units and a plurality of second pixel units. The pixel units are arranged in an array and each of the first pixel units includes one of the first light emitting devices or one of the second light emitting devices. A pitch between the pixel units is identical.

In an embodiment of the disclosure, each of the first light emitting units has at least one micro LED and each of the second light emitting units has at least one micro LED. Each of the auxiliary substrates has a thickness smaller than 5 times a thickness of one of the micro LEDs.

Based on the foregoing, in the design of the light emitting diode display of this disclosure, each of the auxiliary display units is disposed on the peripheral regions of adjacent two of the display units and covers splice seams between the display units to alleviate the conventional problem of discontinuous display images and to improve the display quality. In short, the light emitting diode display of the disclosure may have better display quality.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
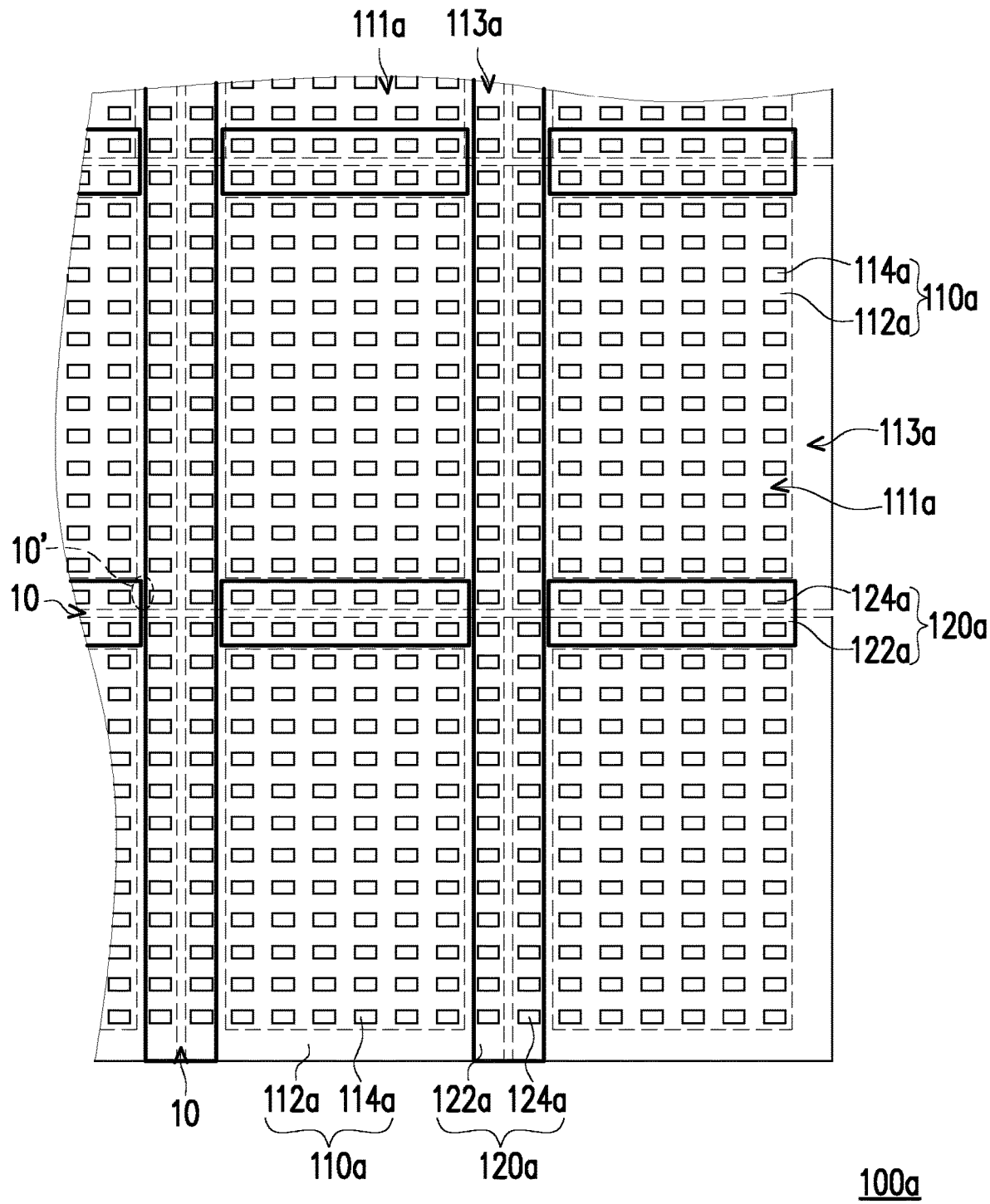
FIG. 1A is a schematic top view showing a part of a light emitting diode display according to an embodiment of the disclosure.
Figure 1B:
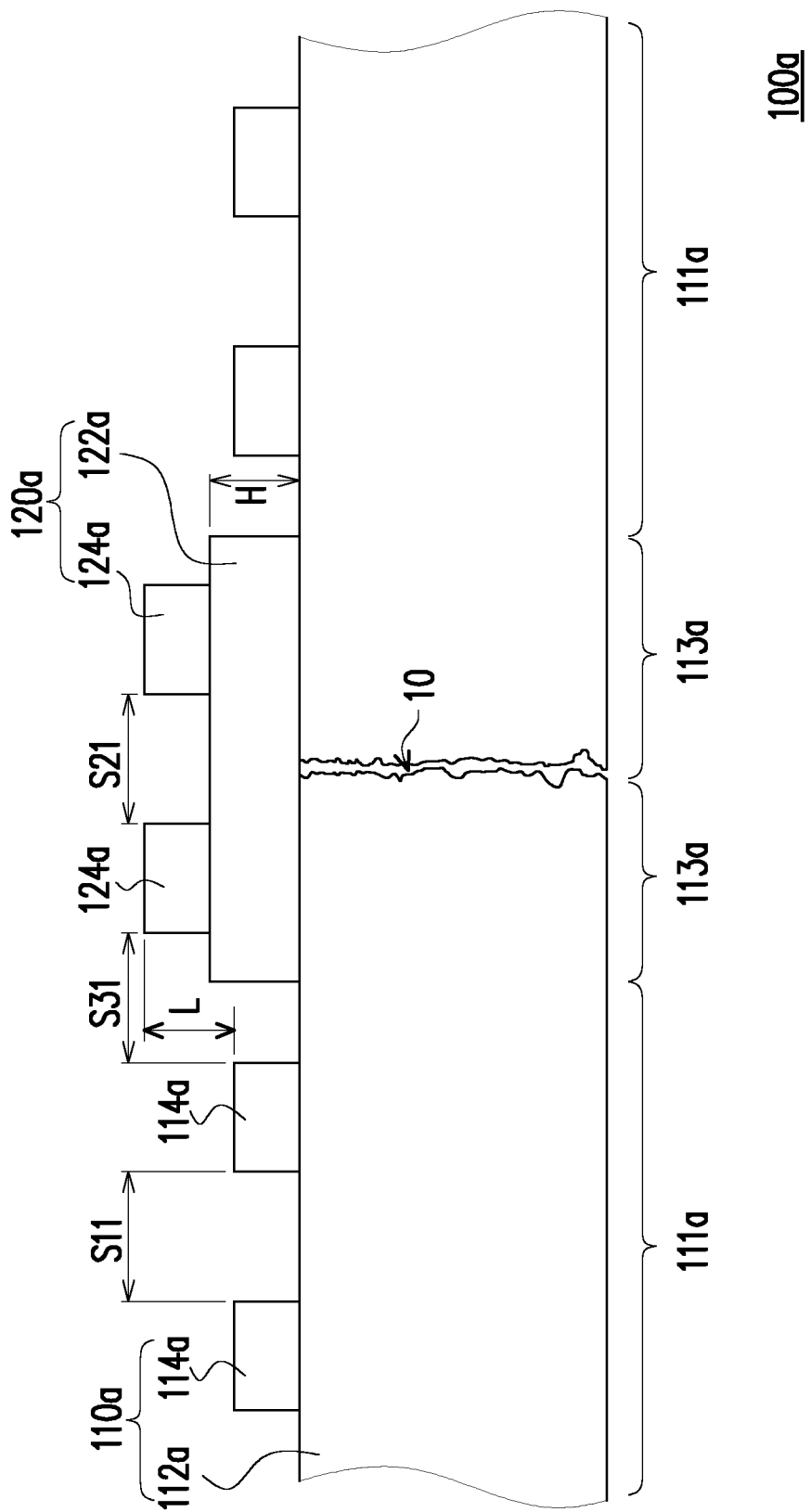
FIG. 1B is a schematic cross-sectional view showing a part of the light emitting diode display of FIG. 1A.

FIG. 1A is a schematic top view showing a part of a light emitting diode display according to an embodiment of the disclosure. FIG. 1B is a schematic cross-sectional view showing a part of the light emitting diode display of FIG. 1A. With reference to FIGS. 1A and 1B simultaneously, in this embodiment, a light emitting diode display 100a includes a plurality of display units 110a and a plurality of auxiliary display units 120a. The display units 110a are arranged in an array and connected to each other. Each of the display units 110a has a device arrangement region 111a, a peripheral region 113a surrounding the device arrangement region 111a, and a plurality of first light emitting devices 114a disposed on the device arrangement region 111a and arranged in an array. The auxiliary display units 120a are disposed on the peripheral regions 113a of the display units 110a. Each of the auxiliary display units 120a includes an auxiliary substrate 122a and a plurality of second light emitting devices 124a arranged in an array. The second light emitting devices 124a of one auxiliary unit 120a are disposed on the auxiliary substrate 122a of the one auxiliary unit 120a and located at a level different from a level of the first light emitting devices 114a. The auxiliary substrate 122a is arranged across adjacent two of the display units 110a.

It should be noted that each of the light emitting devices of this embodiment (i.e., the first light emitting devices 114a and the second light emitting devices 124a) has at least one micro light emitting diode (micro LED), for example, one light emitting device includes one LED chip in this embodiment, such as a red micro LED, a green micro LED, or a blue micro LED. That is to say, one light emitting diode represents one sub-pixel.

With reference to FIGS. 1A and 1B simultaneously again, in this embodiment, the first light emitting devices 114a are only disposed on the device arrangement regions 111a of the display units 110a. In other words, the first light emitting devices 114a are not disposed on the peripheral regions 113a of the display unit 110a. Herein the first light emitting devices 114a and the second light emitting devices 124a are identical in size, and each of the foregoing light emitting devices (i.e., the first light emitting devices 114a and the second light emitting devices 124a) has a size length in a range of 3 μm to 150 μm, for example. Preferably, each of the micro LED has a size length in a range of 10 μm to 60 μm, and a thickness in a range of 3 μm to 8 μm.

In detail, in this embodiment, each of the display units 110a includes a substrate 112a, and the first light emitting devices 114a are disposed on the substrate 112a. The substrate 112a has the device arrangement region 111a and the peripheral region 113a, and the substrate 112a is, for example, a glass substrate, a semiconductor substrate, a submount substrate, a complementary metal-oxide-semiconductor (CMOS) circuit substrate, a liquid crystal on silicon (LCOS) substrate, or other suitable substrates. Herein a thickness of the substrate 112a is approximately in a range of 200 μm to 3 mm.

Furthermore, a plurality of splice seams 10 are defined between the display units 110a. One of the splice seams 10 is formed between adjacent two of the display units 110a. The auxiliary display units 120a are located on the splice seams 10 respectively, in other words, each of the auxiliary substrates 122a covers at least one splice seam 10 and at least two peripheral regions 113a of adjacent two display units 110a. Herein, the splice seams 10 refer to gaps between any adjacent two of the display units 110a, including gaps between long sides of two adjacent display units 110a and gaps between short sides of two adjacent display units 110a. The auxiliary substrate 122a is, for example, a ceramic substrate, a semiconductor substrate, a submount substrate, a complementary metal-oxide-semiconductor (CMOS) circuit substrate, a flexible substrate, or other suitable substrates.

With reference to FIGS. 1A and 1B simultaneously again, in this embodiment, the first light emitting devices 114a are arranged in an array within the device arrangement region 111a of each of the substrates 112a, and the second light emitting devices 124a are arranged in an array on each of the auxiliary substrates 122a. In the top view, the first light emitting devices 114a and the second light emitting devices 124a form a regular array and fill the display screen of the light emitting diode display 100a to display a complete frame. A step height L exists between the second light emitting device 124a and the first light emitting device 114a, and the position of the second light emitting device 124a is higher than the position of the first light emitting device 114a. More specifically, the step height L exists between one of the second light emitting devices 124a (a micro LED on the auxiliary substrate 122a) and one of the first light emitting devices 114a (a micro LED on the substrate 112a), and the vertical distance H should be as small as possible. Generally speaking, the vertical distance H is approximately equal to a thickness of the auxiliary substrate 122a. In other words, the thickness of the auxiliary substrate 122a should be as thinner as possible, so that the height drop is not too large to affect the display quality. In this embodiment, the vertical distance H is 1 to 5 times the thickness of the first light emitting device 114a. However, in other embodiments, the vertical distance H may also be smaller than the thickness of one of the first light emitting devices 114a (one micro LED on the substrate 112a), and such configuration still falls within the protective scope of the disclosure. Briefly, in this embodiment, the second light emitting devices 124a and the first light emitting devices 114a are located at different levels. In other embodiment, for example, a hardboard auxiliary substrate is used in a larger-sized light emitting diode display with the thickness of the auxiliary substrate approximately in a range of 150 μm to 250 μm; a flexible auxiliary substrate is used in a smaller-sized light emitting diode display, and the thickness of the auxiliary substrate may be reduced to be in a range of 3 μm to 100 μm. Preferably, the thickness of the auxiliary substrate 122a is smaller than the thickness of the substrate 112a.

Particularly, a first horizontal spacing S11 exists between adjacent two of the first light emitting devices 114a, a second horizontal spacing S21 exists between adjacent two of the second light emitting devices 124a, and a third horizontal spacing S31 exists between one of the first light emitting devices 114a and one of the second light emitting devices 124a that are adjacent to each other. Preferably, the first horizontal spacing S11 is substantially equal to the second horizontal spacing S21 and the second horizontal spacing S21 is substantially equal to the third horizontal spacing S31. On the other hand, the first horizontal spacing S11, the second horizontal spacing S21 and the third horizontal spacing S31 are the same. In other words, in the top view of FIG. 1A, the first light emitting devices 114a and the second light emitting devices 124a are spaced apart at equidistant intervals. Due to process variation, the same spacing in this embodiment indicates being within an error range of 10% of the spacing value approximately, and more preferably within 5%. By the foregoing design, the light emitting diode display 100a may have a better display quality.

It should be noted that the splice seams 10 are formed because of side-surface roughness of the substrate 112a of the display unit 110a after cutting. Therefore, when used as the light emitting diode display 100a after splicing, the viewer may see the splice seams 10. Such problem is particularly obvious in the case of high-resolution or large-size displays. Therefore, in this embodiment, the light emitting diode display 100a has the auxiliary display units 120a, which are disposed on the splice seams 10 between adjacent two of the display units 110a. The auxiliary substrates 122a of the auxiliary display units 120a shield the splice seams 10. Accordingly, projections of each auxiliary substrate 122a in a direction perpendicular to the substrate 112a overlaps at least one of the splice seams 10. Herein a splice slit 10' exists between adjacent two of the auxiliary display units 120a, and a projection of each splice slits 10' in a direction of the substrate 112a forms an included angle with the splice seams 10, which is an included angle of 90 degrees in this embodiment. That is to say, the splice slit 10' is across one of the splice seams 10. In other words, the splice junctures 10' between the auxiliary display units 120a are disposed discontinuously. The splice junctures 10' between the auxiliary display units 120a and the splice seams 10 between the display units 110a may even be made to be staggered, so that it is not easy to perceive the splice seams 10 when viewing the light emitting diode display 100a in its entirety. Furthermore, the display images at the interface is made continuous by the matching of the spacing between the second light emitting device 124a of the auxiliary display unit 120a and the first light emitting device 114a of the display unit 110a. Consequently, the light emitting diode display 100a of this embodiment may have better display quality.

It should be noted that the display unit 110a and the auxiliary display unit 120a of this embodiment may be connected to an external IC respectively. Surely, in other embodiments, the auxiliary display unit 120a may be connected to the external IC after being connected to the display unit 110a. Alternatively, the auxiliary display unit 120a may be a circuit board in itself and may directly control the second light emitting devices 124a. The foregoing configurations all fall within the protective scope of the disclosure.

It should be noted that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated in the following embodiments.

Figure 1C:
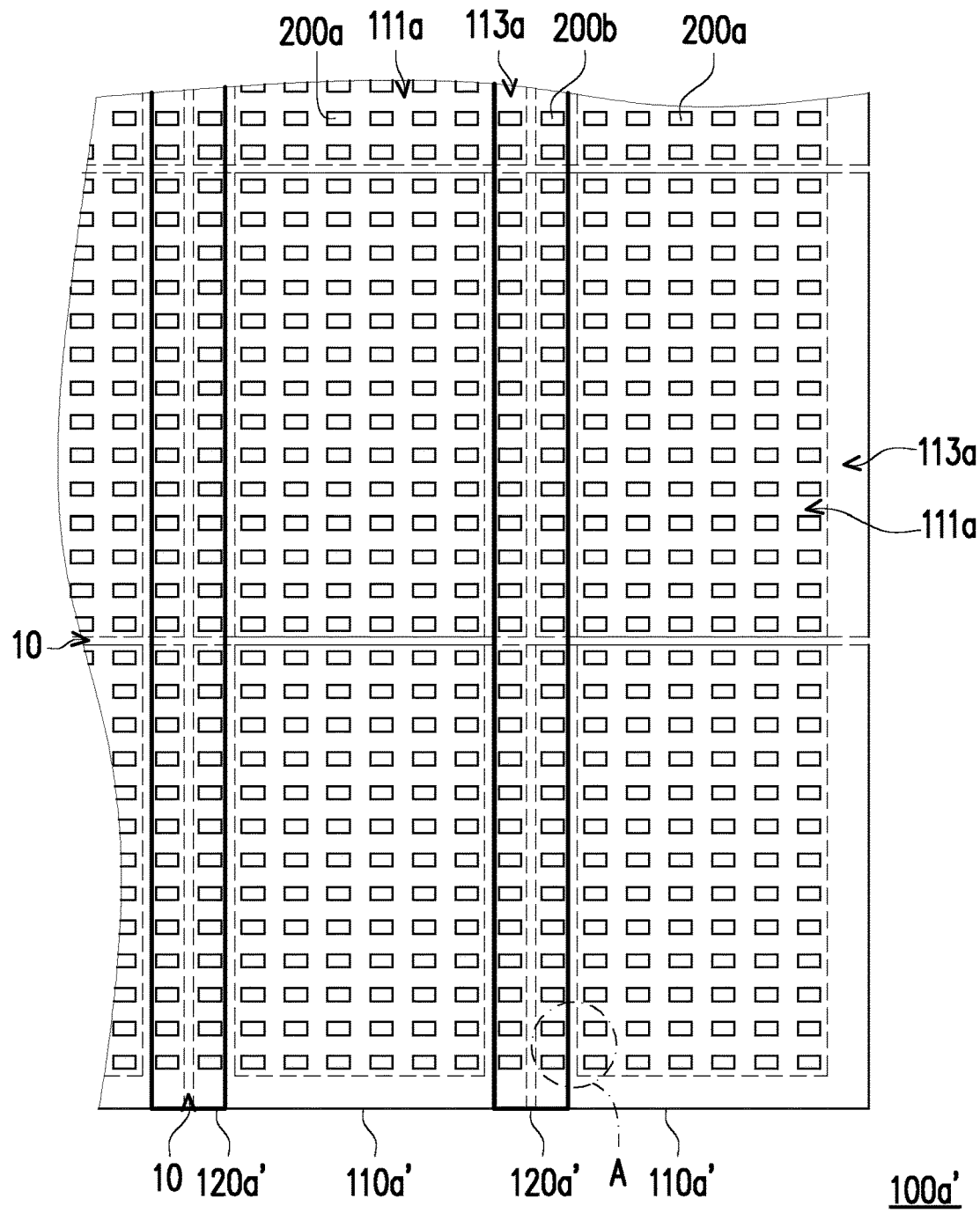
FIG. 1C is a schematic top view showing a part of a light emitting diode display according to another embodiment of the disclosure.
Figure 1D:
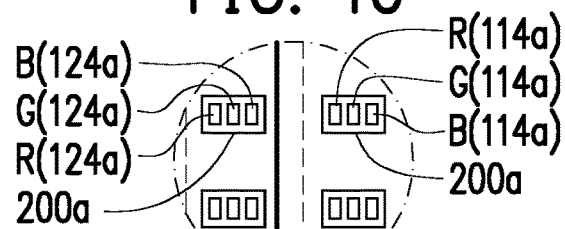
FIG. 1D is a schematic view showing the area A of the light emitting diode display of FIG. 1C.

FIG. 1C is a schematic top view showing a part of a light emitting diode display according to another embodiment of the disclosure. FIG. 1D is a schematic view showing the area A of the light emitting diode display of FIG. 1C. With reference to FIGS. 1A, 1C and 1D simultaneously, a light emitting diode display 100a' is similar to the light emitting diode display 100a of FIG. 1A. A difference between the two is that auxiliary display units 120a' of this embodiment are only disposed on long sides of two adjacent display units 110a'. In this embodiment, the light emitting diode display 100a' further includes a plurality of pixel units 200a arranged in an array. Each of the pixel units 200a includes at least one of the first light emitting devices 114a, or at least one of the second light emitting devices 124a. In this embodiment, one of the first light emitting devices 114a comprises three micro LEDs (i.e., a blue micro LED B, a green micro LED G, and a red micro LED R) and one of the second light emitting devices 124a comprises three micro LEDs (e.g. a blue micro LED B, a green micro LED G, and a red micro LED R). A pitch between the pixel units 200a is identical. It should be noted that in this embodiment, each of the light emitting devices (i.e., the first light emitting devices 114a and the second light emitting devices 124a) is equivalent to a display pixel (one of the pixel units). In other embodiments, each of the light emitting devices in the pixel units 200a is a package device including the red micro LED R, the green micro LED G and the blue micro LED B.

Figure 2:
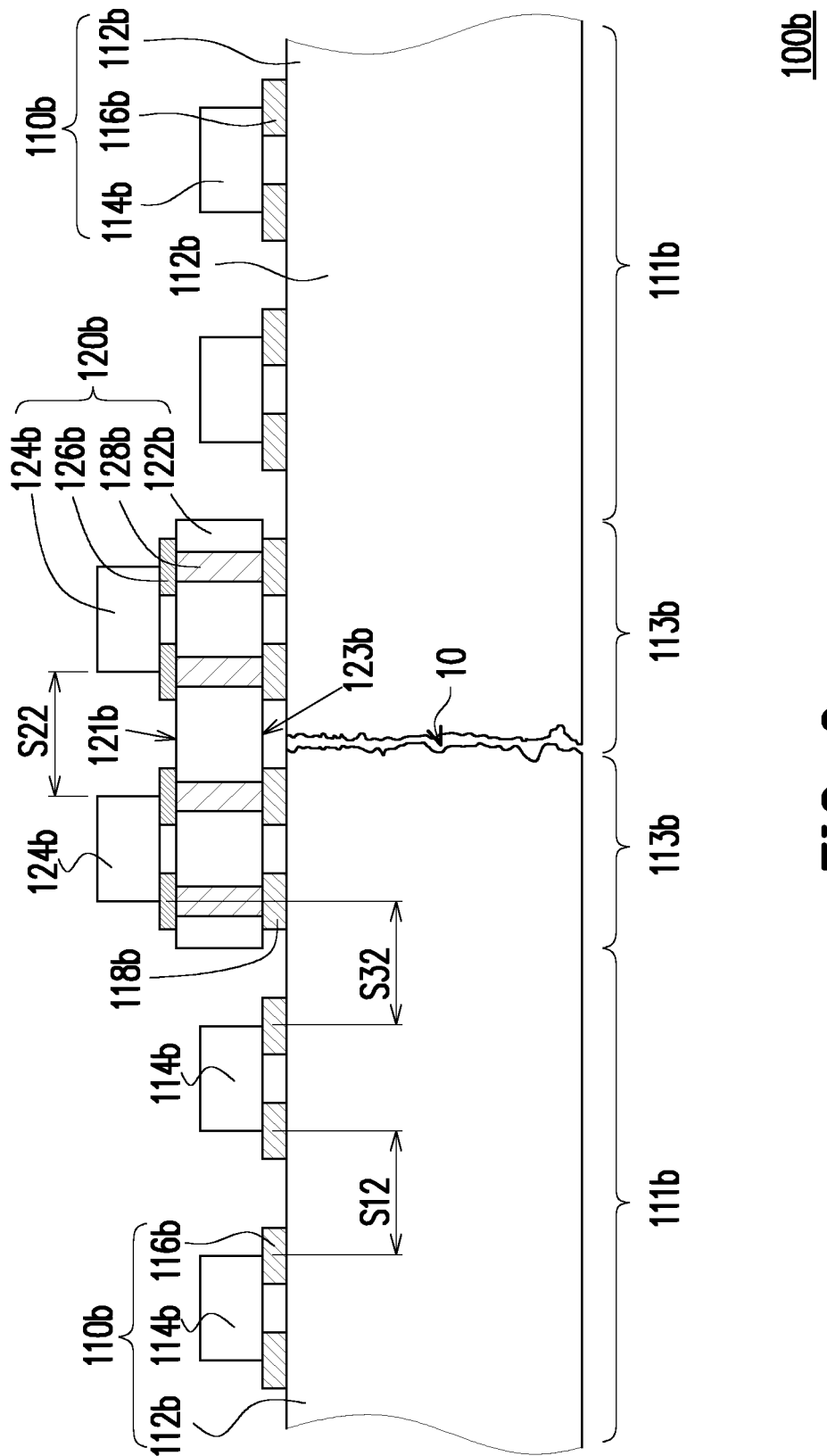
FIG. 2 is a schematic cross-sectional view showing a part of a light emitting diode display according to another embodiment of the disclosure.

FIG. 2 is a schematic cross-sectional view showing a part of a light emitting diode display according to another embodiment of the disclosure. With reference to FIGS. 1B and 2 simultaneously, a light emitting diode display 100b in this embodiment is similar to the light emitting diode display 100a of FIG. 1B. A difference between the two is that each of the display units 110b further includes a plurality of first pads 116b and a conducting circuit 118b. The first pads 116b are disposed on a device arrangement region 111b of a substrate 112b and are separated from each other. Herein, first light emitting devices 114b of this embodiment are each embodied to be a micro LED. As shown in FIG. 2, in this embodiment, the first light emitting devices 114b are embodied to be a structure of flip-chip micro LEDs, i.e., each of the first light emitting devices 114b is connected to two of the first pads 116b located in the device arrangement region 111b. Auxiliary display units 120b are electrically connected to the conducting circuits 118*b* located in peripheral regions 113*b*. Each of the auxiliary display units 120*b* further includes a plurality of second pads 126*b* and a plurality of conductive structures 128*b*. An auxiliary substrate 122*b* has an upper surface 121*b* and a lower surface 123*b* opposite to the upper surface 121*b*. Herein, the second pads 126*b* are disposed on the upper surface 121*b* of the auxiliary substrate 122*b*, and second light emitting devices 124*b* are electrically connected to the second pads 126*b*. The conductive structures 128*b* penetrate the auxiliary substrate 122*b* from the upper surface 121*b* to the lower surface 123*b*, and the conductive structures 128*b* electrically connect the corresponding conducting circuit 118*b* and the corresponding second pads 126*b*. That is, the conductive structures 128*b* are electrically connected to the conducting circuit 118*b*.

Herein, a first horizontal spacing S12 exists between adjacent two of the first light emitting devices 114*b* on the substrate 112*b*, a second horizontal spacing S22 exists between adjacent two of the second light emitting devices 124*b* on the auxiliary substrate 122*b*, and a third horizontal spacing S32 exists between one of the first light emitting devices 114*b* and one of the second light emitting devices 124*b* adjacent to the one of the first light emitting devices 114*b*. Preferably, the first horizontal spacing S12, the second horizontal spacing S22 and the third horizontal spacing S32 are approximately the same. By the foregoing design, the light emitting diode display 100*b* may have a better display quality.

Figure 3:
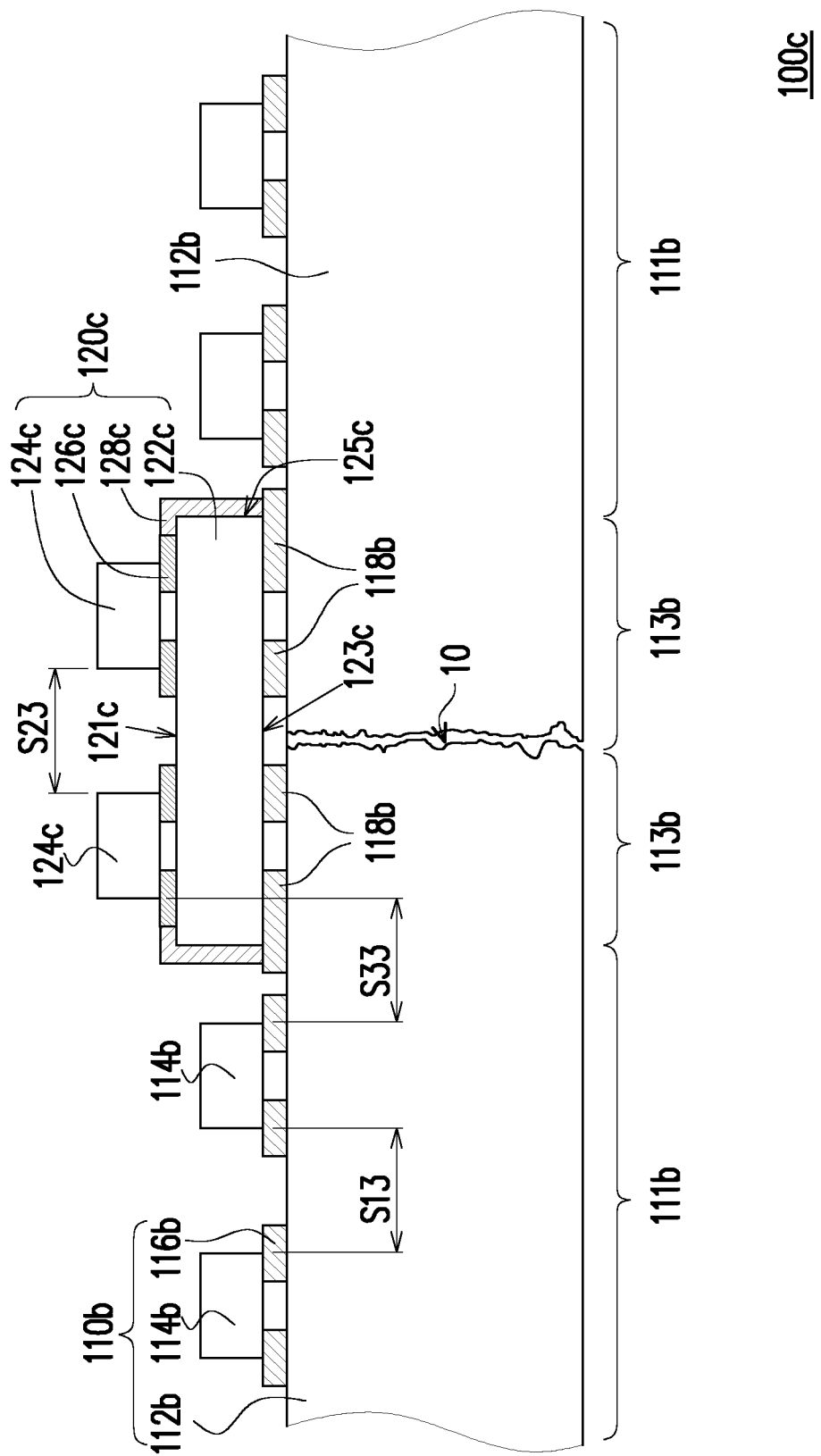
FIG. 3 is a schematic cross-sectional view showing a part of a light emitting diode display according to another embodiment of the disclosure.

FIG. 3 is a schematic cross-sectional view showing a part of a light emitting diode display according to another embodiment of the disclosure. With reference to FIGS. 2 and 3 simultaneously, a light emitting diode display 100*c* in this embodiment is similar to the light emitting diode display 100*b* of FIG. 2. A difference between the two is that, the conductive structures 128*b* of the auxiliary display unit 120*b* of FIG. 2 are replaced by connecting conductive lines 128*c* of an auxiliary display unit 120*c*. In detail, in this embodiment, each of the auxiliary display units 120*c* includes the connecting conductive lines 128*c* and an auxiliary substrate 122*c* having a side surface 125*c*, an upper surface 121*c* and a lower surface 123*c*, and the side surface 125*c* connects the upper surface 121*c* and the lower surface 123*c*. The connecting conductive lines 128*c* are formed on the auxiliary substrate 122*c*, connect the second pads 126*c* and extend to the side surface 125*c*, and connect to the conducting circuits 118*b* on a substrate 112*b*. On the other hand, the connecting conductive lines 128*c* electrically connect the second pads 126*c* and the conducting circuits 118*b*. That is, the second light emitting devices 124*c* on the auxiliary display units 120*c* receive an electrical signal from the display units 110*b*.

Herein, a first horizontal spacing S13 exists between adjacent two of first light emitting devices 114*b*, a second horizontal spacing S23 exists between adjacent two of the second light emitting devices 124*c*, and a third horizontal spacing S33 exists between one of the first light emitting devices 114*b* and one of the second light emitting devices 124*c* that are adjacent to each other. Preferably, the first horizontal spacing S13, the second horizontal spacing S23 and the third horizontal spacing S33 are the same. By the foregoing design, the light emitting diode display 100*c* may have better display quality.

In summary, in the design of the light emitting diode display of this disclosure, the auxiliary display units are disposed on the peripheral regions of adjacent two of the display units, thereby alleviating boundary issue between adjacent two of the display panels so as to improve the display quality.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light emitting diode display, comprising:
a plurality of display units arranged in an array and connected to each other, each of the display units having a device arrangement region, a peripheral region surrounding the device arrangement region, and a plurality of first light emitting devices disposed on the device arrangement region and arranged in an array; and
a plurality of auxiliary display units disposed on the peripheral regions of the display units, each of the auxiliary display units comprising an auxiliary substrate and a plurality of second light emitting devices arranged in an array, wherein the second light emitting devices are disposed on the auxiliary substrate and located at a level different from a level of the first light emitting devices, and each of the auxiliary substrates is across adjacent two of the display units,
wherein a first horizontal spacing exists between adjacent two of the first light emitting devices on one of the display units, a second horizontal spacing exists between adjacent two of the second light emitting devices on one of the auxiliary display units, wherein the first horizontal spacing is equal to the second horizontal spacing, and
wherein a third horizontal spacing exists between one of the first light emitting devices and one of the second light emitting devices that are adjacent to each other, and the third horizontal spacing is equal to the second horizontal spacing.

2. The light emitting diode display as recited in claim 1, wherein a splice seam is formed between adjacent two of the display units, and the auxiliary display units are located on the splice seams respectively.

3. The light emitting diode display as recited in claim 2, wherein a splice slit exists between adjacent two of the auxiliary display units, and the splice slit is across one of the splice seams.

4. The light emitting diode display as recited in claim 1, wherein each of the display units comprises a substrate, a conducting circuit and a plurality of first pads, the substrate has the device arrangement region and the peripheral region, the first pads are disposed on the device arrangement region of the substrate and are separated from each other, the first light emitting devices are electrically connected to the substrate by bonding to the first pads, and the conducting circuit is disposed on the peripheral region and electrically connects to at least one of the auxiliary display units.

5. The light emitting diode display as recited in claim 4, wherein each of the auxiliary substrates has an upper surface and a lower surface that are opposite to each other, the lower surface faces to the conducting circuit, and each of the auxiliary display units further comprises:

a plurality of second pads disposed on the upper surface of the auxiliary substrate, wherein the second light emitting devices are electrically connected to the second pads; and a plurality of conductive structures penetrating the auxiliary substrate and electrically connecting the second pads to at least one of the conducting circuits.

6. The light emitting diode display as recited in claim 4, wherein each of the auxiliary substrate has an upper surface, a lower surface opposite to the upper surface, and a side surface connecting the upper surface and the lower surface, and each of the auxiliary display units further comprises:

a plurality of second pads disposed on the upper surface of the auxiliary substrate, wherein the second light emitting devices are electrically connected to the second pads; and a plurality of conductive lines disposed on the auxiliary substrate, wherein the conductive lines form on the upper surface and extend to the side surface, and the conductive lines are connected the second pads to the conducting circuits.

7. The light emitting diode display as recited in claim 1, wherein each of the first light emitting devices has at least one micro LED and each of the second light emitting devices has at least one micro LED, and a step height between one of the micro LEDs on the auxiliary substrate and one of the micro LEDs on the substrate is 1 to 5 times a thickness of the one of the micro LEDs on the substrate.

8. The light emitting diode display as recited in claim 1, wherein each of the first light emitting devices has a plurality of micro LEDs and each of the second light emitting devices has a plurality of micro LEDs, and a step height between one of the micro LEDs of the first light emitting devices and one of the micro LEDs of the second light emitting devices is 1 to 5 times a thickness the one micro LEDs of the first light emitting devices.

9. The light emitting diode display as recited in claim 1, wherein the first light emitting devices and the second light emitting devices are identical in size.

10. The light emitting diode display as recited in claim 9, wherein each of the first light emitting devices has at least one micro LED having a size length in a range of 10 μm to 60 μm and a thickness in a range of 3 μm to 8 μm.

11. The light emitting diode display as recited in claim 1, further comprising:

a plurality of pixel units, arranged in an array and each of the pixel units comprising one of the first light emitting devices or one of the second light emitting devices; and wherein a pitch between the pixel units is identical.

12. The light emitting diode display as recited in claim , wherein each of the first light emitting devices has at least one micro LED and each of the second light emitting devices has at least one micro LED, and each of the auxiliary substrates has a thickness smaller than 5 times a thickness of one of the micro LEDs.

* * * * *